(12) United States Patent
Matsuda

(10) Patent No.: US 6,210,980 B1
(45) Date of Patent: *Apr. 3, 2001

(54) INSPECTION PATTERN AND METHOD FOR SEMICONDUCTOR DEVICE

(75) Inventor: Hiroo Matsuda, Tokyo (JP)

(73) Assignee: NEC Corporation, Tokyo (JP)

( * ) Notice: This patent issued on a continued prosecution application filed under 37 CFR 1.53(d), and is subject to the twenty year patent term provisions of 35 U.S.C. 154(a)(2).

Subject to any disclaimer, the term of this patent is extended or adjusted under 35 U.S.C. 154(b) by 0 days.

(21) Appl. No.: 09/090,876

(22) Filed: Jun. 5, 1998

(30) Foreign Application Priority Data

Jun. 6, 1997 (JP) .................................... 9-149586

(51) Int. Cl.$^7$ ...................................... G01R 31/26
(52) U.S. Cl. ...................................... 438/4; 435/5
(58) Field of Search ...................... 438/14, 18, 8

(56) References Cited

U.S. PATENT DOCUMENTS 5,900,645 * 5/1999 Yamada .

FOREIGN PATENT DOCUMENTS

| 405129400 | * 5/1993 | (JP) . |
| 6-069307 | 3/1994 | (JP) . |
| 7-297277 | 11/1995 | (JP) . |

* cited by examiner

Primary Examiner—Charles Bowers
Assistant Examiner—Scott J Hawranek
(74) Attorney, Agent, or Firm—Foley & Lardner

(57) ABSTRACT

An inspection pattern for a semiconductor device includes at least one inspection pattern groove and a dummy interconnection. The inspection pattern groove is formed in an interlevel insulating film or lower interconnection covering a surface of a semiconductor substrate. The dummy interconnection is formed to intersect the inspection pattern groove by burying a metal material in the inspection pattern groove. The dummy interconnection has a side wall which is exposed in the groove-like opening portion and which is inspected whether a void is present therein. An inspection method for a semiconductor device is also disclosed.

12 Claims, 4 Drawing Sheets

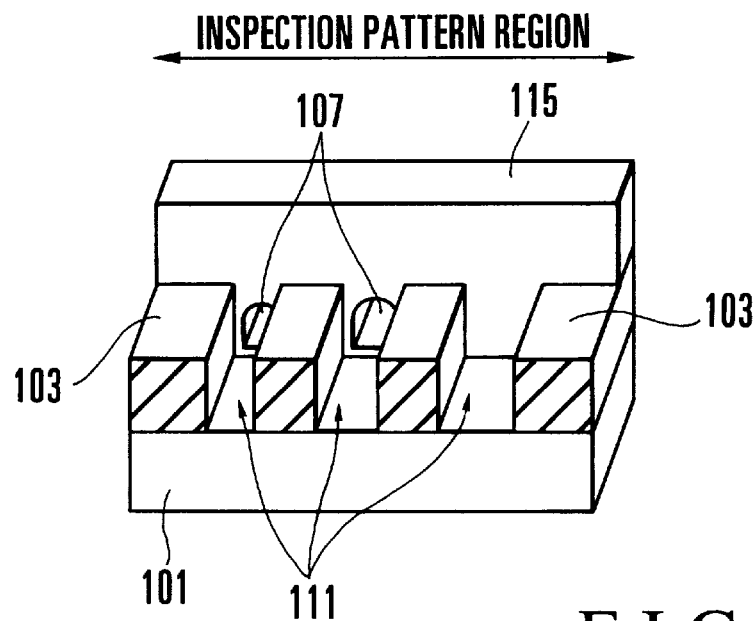
F I G. 2
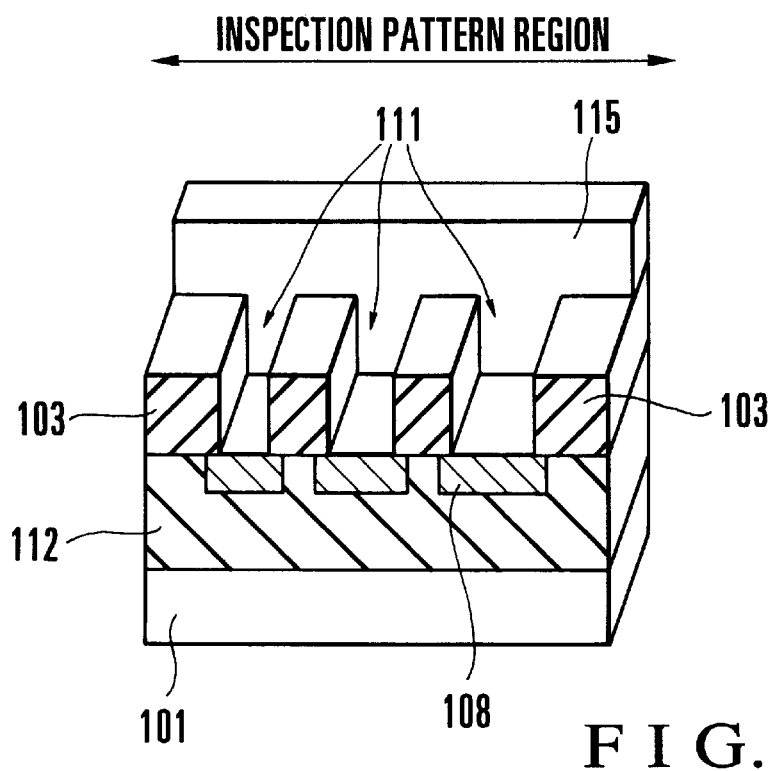
F I G. 3

INSPECTION PATTERN AND METHOD FOR SEMICONDUCTOR DEVICE

BACKGROUND OF THE INVENTION

The present invention relates to an inspection method for a semiconductor device and, more particularly, to a method of detecting the presence/absence of a void in a contact hole or through hole.

As the semiconductor integrated circuits become more and more micropatterned, the step coverage of a metal interconnection, and particularly an Al metal interconnection, in a contact hole or through hole degrades, and poses problems of conduction failures and increases in interconnection resistance. For this reason, a method of burying an Al alloy material in the contact hole or through hole of a substrate by sputtering has become put into practice. The method of burying the alloy material by sputtering includes a high-temperature sputtering method. According to this method, a semiconductor substrate is heated to several hundred ° C. (usually 400° C. or more), and an Al alloy material film is formed by sputtering. The Al alloy material is buried in a contact hole or through hole, while it is set in a reflow state or in a state exhibiting characteristics close to it, to form a film.

With the high-temperature sputtering method, a burying defect is caused by several factors, e.g., when a chamber atmosphere leakage occurs during sputtering or the heating temperature of the semiconductor substrate is low due to the apparatus failure.

In such a case, the burying defect must be detected. When a buried film is formed by the high-temperature sputtering, two types of defects occur, i.e., a defect in which an Al alloy material 5 is not planarized above the upper portion of a contact hole 4, as shown in FIG. 4A, and a defect in which an Al alloy material 5 forms a void 7 in a contact hole 4, as shown in FIG. 4B. Reference numeral 1 denotes a silicon substrate, and 3, an interlevel insulating film.

The burying defect of the type shown in FIG. 4A can be determined by outer-appearance inspection. The burying defect of the type shown in FIG. 4B is conventionally detected by cleaving the contact hole portion and observing the cleaved portion with an SEM (Scanning Electron Microscope). With this method, an accurate evaluation cannot be performed unless observation is performed for a large number of samples, and much time and labor are accordingly required. For this reason, as methods other than those employing cleavage confirmation, the following inspection methods have been proposed.

Japanese Patent Laid-Open No. 6-69307 discloses a method as shown in FIG. 5A. According to this method, the presence/absence of a reacted alloy layer 10 is confirmed. The reacted alloy layer 10 is formed by reaction between an underlying metal 9, e.g., a Ti layer, formed by sputtering in order to improve the burying properties, and an Al alloy material buried in a contact hole 4 by high-temperature sputtering. A burying defect is inspected in accordance with the presence/absence of the reacted alloy layer 10. The presence/absence of the reacted alloy layer 10 is confirmed by removing the Al alloy material on the reacted alloy layer 10 by etching.

Japanese Patent Laid-Open No. 7-297277 discloses a method as shown in FIG. 5B. According to this method, an Al alloy material 5 is buried. The Al alloy material 5 above a contact hole 4 is then removed by etching. A void 7 in the contact hole 4 is inspected with an SEM or the like.

In each prior art described above, the Al alloy material 5 above the contact hole 4 or through hole must be removed by etching, thus increasing the number of steps. This is because the conditions for removing the Al alloy material 5 above the contact hole 4 or through hole by etching and the etching conditions for interconnection formation of the Al alloy material 5 are different.

If a predetermined underlying metal 9 does not exist, the method of inspecting the burying properties by confirming the presence/absence of the reacted alloy layer 10 formed by reaction between the Al alloy material 5 and the underlying metal 9 cannot be employed, because no reacted alloy layer 10 is formed. Even if a reacted alloy layer 10 is formed, since a burying defect may have occurred, a problem may occur in the inspection precision.

This is due to the following reason. When a chamber atmosphere leakage occurs during high-temperature sputtering or the temperature of the semiconductor substrate 1 is decreased for some reason during sputtering, even if a burying defect occurs, a reacted alloy layer 10 is formed.

SUMMARY OF THE INVENTION

It is an object of the present invention to provide an inspection pattern and method for a semiconductor device that can detect a burying defect of a contact hole or through hole easily within a short period of time.

In order to achieve the above object, according to the present invention, there is provided an inspection pattern for a semiconductor device, comprising at least one groove-like opening portion formed in an insulating film covering a surface of a semiconductor substrate, and a projection formed to intersect the groove-like opening portion by burying a metal material in the groove-like opening portion, the projection having a side wall which is exposed in the groove-like opening portion and which is inspected whether a void is present.

BRIEF DESCRIPTION OF THE DRAWINGS

FIG. 2 is a sectional perspective view of the main part of the semiconductor device which is inspected with the inspection method shown in FIGS. 1A to 1C;

FIG. 3 is a view showing an inspection method for a semiconductor device according to another embodiment of the present invention;

DESCRIPTION OF THE PREFERRED EMBODIMENTS

The present invention will be described in detail with reference to the accompanying drawings.

Figure 1A:
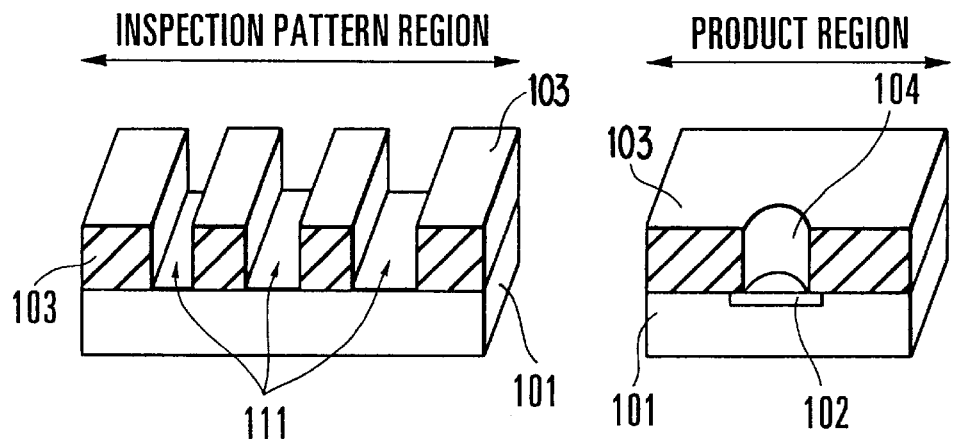
FIGS. 1A to 1C are views showing an inspection method for a semiconductor device according to an embodiment of the present invention.
Figure 1B:
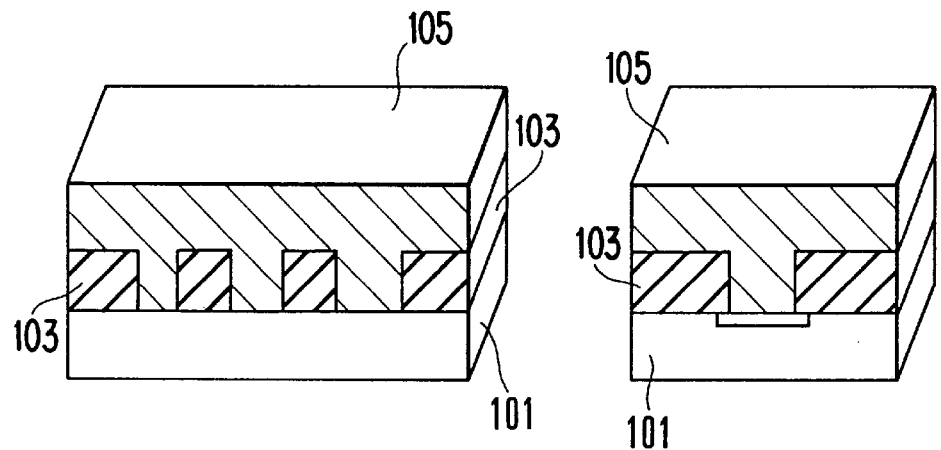
Figure 1C:
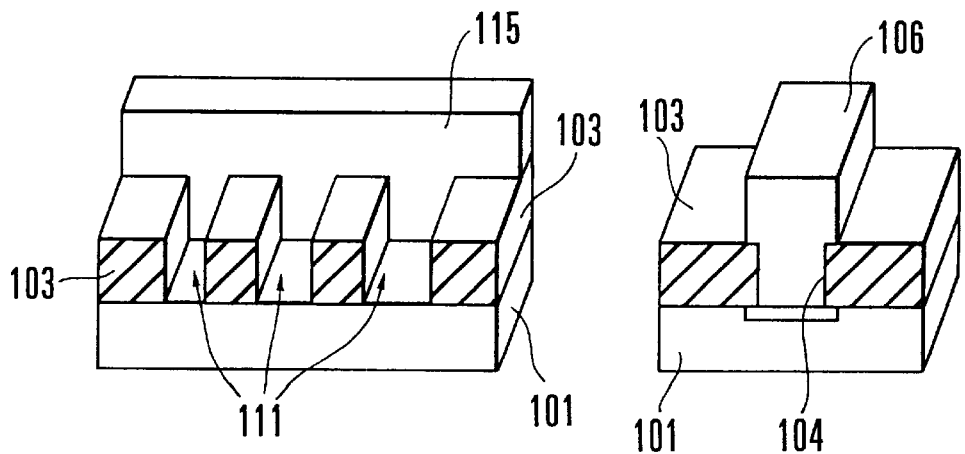
Figure 4A:
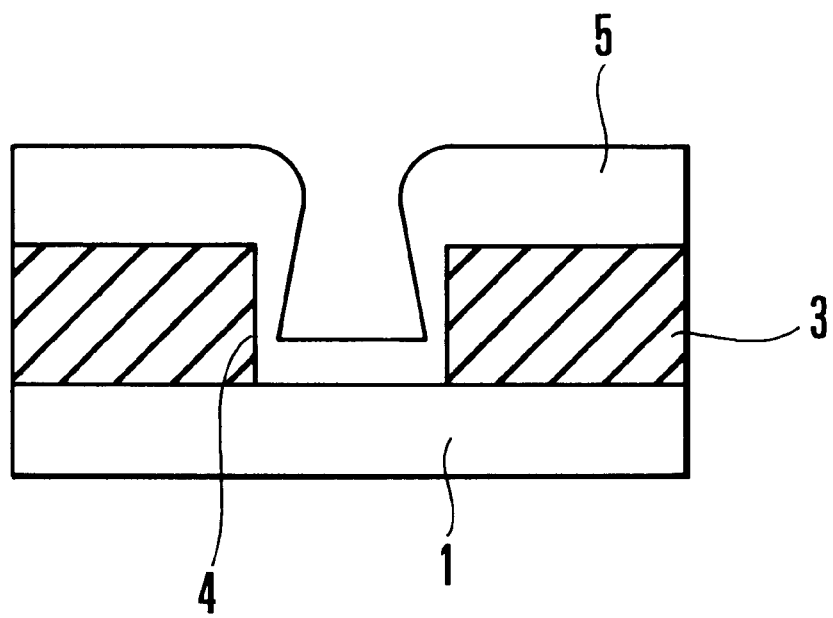
FIGS. 4A and 4B are sectional views of the main part of a semiconductor device exhibiting a burying defect.
Figure 4B:
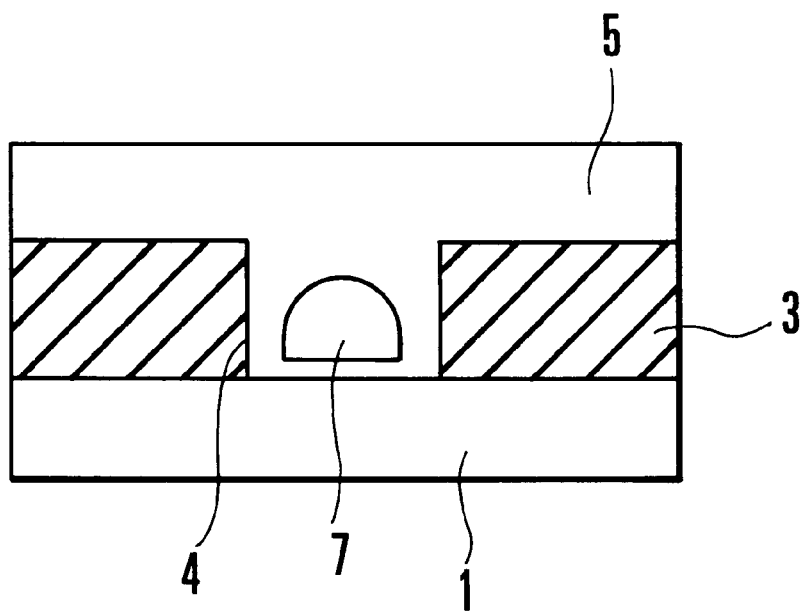
Figure 5A:
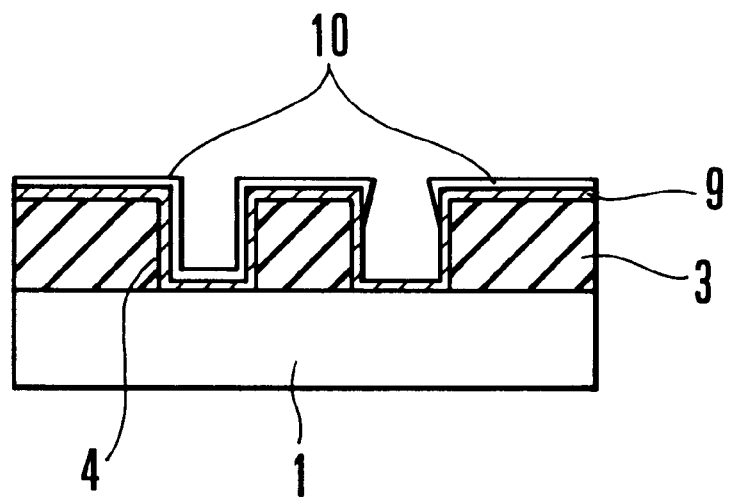
FIGS. 5A and 5B are views showing a conventional inspection method for a semiconductor device.
Figure 5B:
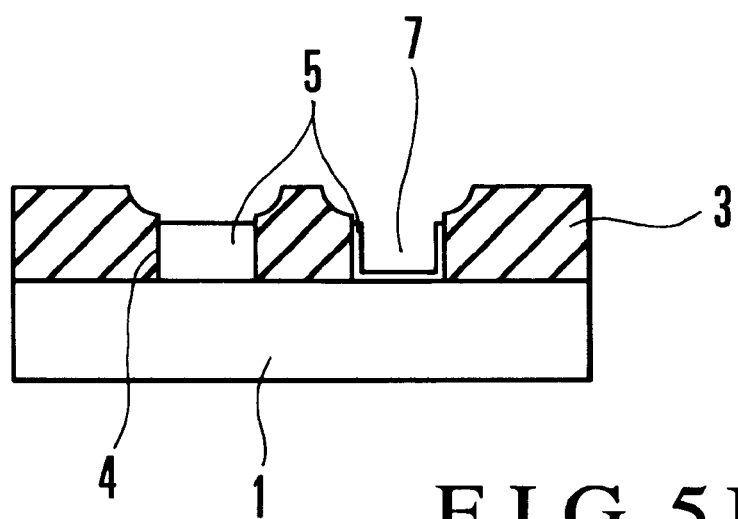

FIGS. 1A to 1C show an inspection method for a semiconductor device according to an embodiment of the present invention. A 1-$\mu$m thick interlevel insulating film 103 constituted by an oxide film is formed on a silicon substrate 101 by CVD (Chemical Vapor Deposition). As shown in FIG. 1A, a contact hole 104 having a diameter of 1 $\mu$m is formed by a photoresist and selective etching in the interlevel insulating film 103 on a diffusion layer 102 formed in the product region of the silicon substrate 101. Simultaneously, a plurality of inspection pattern grooves (groove-like opening portions) 111 having a length of 5 μm are formed in the interlevel insulating film 103 in the inspection pattern region of the silicon substrate 101 to respectively have widths of 0.8 μm, 0.9 μm, and 1.0 μm. Regarding etching, chlorine-based dry etching is usually employed. This selective etching is performed to simultaneously form the hole 104 and the grooves 111 in order to reduce the number of steps.

The product region is a region where a semiconductor element having an opening portion, e.g., a through hole or a contact hole, is formed. An inspection region is a region formed on a portion other than the product region in order to inspect the burying properties of the opening portion of the product region. The product region and the inspection pattern region refer to different regions on one silicon substrate 101.

The shape and size of the inspection pattern grooves 111 are selected such that the burying properties of the inspection pattern grooves 111 achieved by the metal material become substantially equivalent to those of the opening portion of the product region. The burying properties achieved by the metal material signify to what degree the metal material is buried well, and vary in accordance with the aspect ratio and shape of the opening portion, the sputtering conditions, and the like.

As shown in FIG. 1B, an Al—0.5 wt % Cu metal material 105 is deposited by high-temperature sputtering at a temperature of 450° C. and a sputtering rate of 0.1 μm/min on the entire surface of the structure to a thickness of 1 μm while burying the contact hole 104 and the inspection pattern grooves 111.

As shown in FIG. 1C, photoresist formation and selective etching are performed to form a metal interconnection 106 extending above the contact hole 104 in the product region. Simultaneously, a projecting dummy interconnection 115 made of Al—0.5% Cu is formed in the inspection pattern region to intersect the inspection pattern grooves 111. The etching conditions for this are the same as the general selective etching conditions. 20% overetching is performed with respect to the thickness, 1 μm of the metal interconnection 106.

As a result, in the inspection pattern region, the metal material 105 which is not masked with the photoresist and is excluded from the dummy interconnection 115 portion is etched. When etching is performed until the surface of the interlevel insulating film 103 is exposed, this is overetching. Etching is continued until the surface of the silicon substrate 101 is exposed in the bottom portions of the inspection pattern grooves 111.

After etching, the side wall of the dummy interconnection 115 exposed in the inspection pattern grooves 111 is obliquely observed with the SEM to inspect the buried state in the inspection pattern grooves 111. FIG. 1C shows a good state wherein all the inspection pattern grooves 111 are filled by burying. When a burying defect occurs, a void 107 is detected in the side wall of the dummy interconnection 115 exposed from the inspection pattern grooves 111, i.e., in the exposed sectional portion of the metal material 105, as shown in FIG. 2. At this time, the presence/absence of the void 107 is confirmed through inspection with the SEM.

In this embodiment, the contact hole 104 in the product region has a diameter of 1 μm, while the groove widths of the inspection pattern grooves in the inspection pattern region are 0.8 μm, 0.9 μm, and 1.0 μm due to the following reason. The contact hole 104 in the product region has a cylindrical shape, while the inspection pattern grooves 111 are a groove-like shape. The difference in groove width aims at preventing a difference in burying properties from being caused by the difference in shape between the contact hole 104 and the inspection pattern grooves 111.

The relationship between the widths of the inspection pattern grooves 111 and the diameter of the contact hole 104, i.e., the relationship in burying properties between the inspection pattern grooves 111 and the contact hole 104 changes in accordance with the aspect ratio and shape of the contact hole 104 and inspection pattern grooves 111, the high-temperature sputtering conditions, and the like. Therefore, the widths of the inspection pattern grooves 111 in the target product must be obtained in advance.

In this manner, since the opening portion (contact hole) in the product region and the groove-like opening portions (inspection pattern grooves) in the inspection pattern region have different shapes, their burying properties also differ. When the groove widths of the groove-like opening portions are appropriately set in accordance with the shape of the opening portion or the like in the product region, the burying properties can be made identical, and the inspection precision can be improved. For this purpose, the relationship between the burying properties of the opening portion in the product region and the burying properties of the groove-like opening portions must be obtained in advance by performing preliminary inspection. Then, appropriate groove widths can be set with respect to the shape and size of the opening portion of the given product region.

Note that the groove-like opening portions include two or more groove-like opening portions having different groove widths. The groove widths are preferably set in accordance with the burying properties of the opening portion, formed in the product region, achieved by the metal material. This improves the relationship between the occurrence of a burying defect in the opening portion of the product region and the occurrence of a burying defect in the groove-like opening portions.

In this embodiment, the opening portion in the product region and the groove-like opening portions in the inspection region are filled with the metal material in the same step. As the metal material, for example, an Al alloy or a Cu-containing Al alloy can be used.

FIG. 3 shows an inspection method for a semiconductor device according to another embodiment of the present invention, in which the present invention is applied to inspect whether a through hole is filled well. A lower interconnection 108 is formed on a silicon substrate 101 through a lower interlevel insulating film 112, and an interlevel insulating film 103 is formed on the lower interconnection 108. Inspection pattern grooves 111 having predetermined widths are formed in the interlevel insulating film 103. A metal material is buried in the inspection pattern grooves 111 and a through hole (not shown) in the product region simultaneously, in the same manner as in FIG. 1B, to form a metal film. This metal film is etched in the same manner as in FIG. 1C to form a dummy interconnection 115. Thereafter, the side wall of the dummy interconnection 115 exposed in the inspection pattern grooves 111 is obliquely observed with the SEM to inspect the buried state in the inspection pattern grooves 111.

Although the direction of the inspection pattern grooves 111 and the direction of the dummy interconnection 115 perpendicularly intersect each other in the embodiments described above, they may intersect each other obliquely at a predetermined angle. This often facilitates observation of the exposed side wall of the dummy interconnection 115. The predetermined angle is 30° to 90°, and preferably 45° to 90°.

As has been described above, according to the present invention, whether a contact hole or through hole is filled well by burying a metal material can be inspected accurately with a simple method.

Whether a contact hole or through hole is filled well by burying a metal material can be inspected accurately in a non-destructive manner without performing cumbersome steps.

The opening portion in the product region and the inspection pattern grooves in the inspection region are formed simultaneously and are filled with a metal material, and the inspection region is selectively etched. Hence, the burying properties of the product region and that of the inspection region can be compared and inspected accurately without increasing the number of semiconductor device manufacturing steps.

The groove widths of the inspection pattern grooves are appropriately set in accordance with the shape of the opening portion in the product region or the like. Hence, the burying properties of the opening portion formed in the product region and that of the inspection pattern grooves can be set equivalent to each other, so that the inspection precision can be improved.

What is claimed is:

1. An inspection method for a semiconductor device, comprising the steps of:

forming at least one groove in an insulating film covering a surface of a semiconductor substrate;

forming a metal film on an entire surface of said insulating film by burying a metal material in said groove;

selectively etching away said metal material from a section of said groove to remove all of said metal material from within said section of said groove to expose the substrate in a bottom of said groove and to expose said metal material remaining in another section of said groove; and inspecting a presence/absence of a void formed in said exposed section of said metal material.

2. A method according to claim 1, wherein the step of selectively etching away said section of said metal material forms a projection with a side wall exposed in said groove.

3. A method according to claim 1, wherein the step of forming said groove comprises forming said groove in said insulating film corresponding to an inspection region of said semiconductor substrate, the step of forming said groove also comprises forming an opening in said insulating film corresponding to a product region of said semiconductor substrate, the step of forming said metal film comprises forming said metal film on said insulating film in said inspection region and said product region by burying said metal material in said groove and said opening, in said inspection region, the step of selectively etching comprises exposing, in said groove, said another section of said metal material, and in said product region, the step of selectively etching comprises forming a metal interconnection extending above said opening.

4. A method according to claim 3, wherein, in said product region, the step of etching comprises the step of forming one of a through hole and a contact hole as said opening.

5. A method according to claim 3, wherein said groove has a groove width which is set in accordance with burying properties of said opening achieved by said metal material.

6. A method according to claim 1, wherein the step of forming said groove comprises the step of forming a plurality of inspection grooves having different groove widths.

7. A method according to claim 1, wherein the step of selectively etching comprises the step of exposing said metal material in a substantially perpendicular orientation to a groove direction of said groove.

8. A method according to claim 1, wherein the step of selectively etching comprises the step of exposing said metal material in an oblique orientation to a groove direction of said groove at an angle.

9. A method according to claim 1, wherein the step of inspecting the presence/absence of said void comprises the step of performing inspection by using a Scanning Electron Microscope.

10. A method according to claim 8, wherein said angle is in a range of 30° to 90°.

11. A method according to claim 1, wherein the step of selectively etching comprises etching away unmasked portions of said metal material to expose said surface of said semiconductor substrate.

12. An inspection method for a semiconductor device, comprising the steps of:

forming a lower interconnection layer in a lower insulating film;

covering a surface of said lower interconnection layer with an upper insulating film;

forming at least one groove in said upper insulating film at a location of the lower interconnection layer;

forming a metal film on an entire surface of said upper insulating film by burying a metal material in said groove;

selectively etching away said metal material from a section of said groove to remove all of said metal material from within said section of said groove to expose the lower interconnection layer in a bottom of said groove and to expose said metal material remaining in another section of said groove; and inspecting a presence/absence of a void formed in said exposed section of said metal material.

* * * * *